United States Patent [19]
Delgado et al.

[11] Patent Number: 5,949,144
[45] Date of Patent: Sep. 7, 1999

[54] PRE-BOND CAVITY AIR BRIDGE

[75] Inventors: Jose Avelino Delgado, Valkaria, Fla.; Stephen Joseph Gaul, Merrimack, N.H.

[73] Assignee: Harris Corporation, Palm Bay, Fla.

[21] Appl. No.: 08/650,762

[22] Filed: May 20, 1996

[51] Int. Cl.⁶ .......................... H01L 27/12; H01L 29/80
[52] U.S. Cl. .................. 257/776; 257/276; 257/226; 257/522; 257/622; 257/758; 257/680; 438/624; 438/619
[58] Field of Search ....................... 257/776, 758, 257/522, 763, 276, 756, 773, 680, 226, 672, 277; 438/624, 669, 619

[56] References Cited

U.S. PATENT DOCUMENTS

| | | | |
|---|---|---|---|
| 4,507,845 | 4/1985 | McIver et al. | 257/276 |
| 4,571,608 | 2/1986 | Johnson | 438/619 |
| 4,710,794 | 12/1987 | Koshino et al. | 257/522 |
| 4,859,629 | 8/1989 | Reardom et al. | 257/735 |
| 4,894,114 | 1/1990 | Nathanson et al. | 257/276 |
| 4,992,764 | 2/1991 | Ayasli | 257/276 |
| 5,041,881 | 8/1991 | Bishop et al. | 257/472 |
| 5,209,119 | 5/1993 | Polla et al. | 73/723 |
| 5,343,064 | 8/1994 | Spangler et al. | 257/350 |
| 5,406,109 | 4/1995 | Whitney | 257/522 |
| 5,426,072 | 6/1995 | Finnila | 257/686 |
| 5,444,015 | 8/1995 | Aitken et al. | 438/619 |
| 5,476,819 | 12/1995 | Warren | 456/629.1 |
| 5,483,092 | 1/1996 | Kosaki | 257/276 |
| 5,491,461 | 2/1996 | Partin et al. | 338/32 R |
| 5,510,645 | 4/1996 | Fitch et al. | 257/522 |
| 5,521,406 | 5/1996 | Tserng et al. | 257/276 |
| 5,548,099 | 8/1996 | Cole, Jr. et al. | 438/619 |
| 5,567,982 | 10/1996 | Bartelink | 257/664 |
| 5,592,018 | 1/1997 | Leedy | 257/632 |
| 5,602,052 | 2/1997 | Beasom | 438/619 |
| 5,608,263 | 3/1997 | Drayton et al. | 257/728 |
| 5,719,433 | 2/1998 | Delage et al. | 257/522 |

*Primary Examiner*—Alexander Oscar Williams
*Attorney, Agent, or Firm*—Jaeckle Fleischmann & Mugel, LLP

[57] ABSTRACT

A handle wafer has a cavity coated with a dielectric. A device wafer is bonded to the handle wafer. Metal lines, devices or circuits fabricated on device layer overlay the cavity in the handle wafer thus reducing parasitic capacitances to the handle wafer and crosstalk through the handle wafer. This constitutes a rugged air bridge structure capable of being passivated and/or being placed in plastic packages.

8 Claims, 2 Drawing Sheets

PRE-BOND CAVITY AIR BRIDGE

FIELD OF THE INVENTION

The present invention relates to integrated circuit air bridge structures and methods of fabricating such structures which facilitate the formation of the integrated circuits and components thereof in bonded wafer structures.

BACKGROUND OF THE INVENTION

In order to reduce interconnect capacitances in high performance and high frequency processes, air bridges are often used. A typical air bridge is formed using a second layer of interconnect metal deposited and patterned over a sacrificial material. The sacrificial material is later removed to leave a metal line surrounded by air rather than a dielectric, such as oxide. Parasitic capacitances to the substrate and other metal lines is thus reduced since air has a lower dielectric constant than do solid insulators such as silicon dioxide or silicon nitride.

However, traditional air bridge manufacturing techniques and structures have several disadvantages. The length of an air bridge is often limited by flexure of metal between two vias. So, relatively long air bridges can only be manufactured by stitching together multiple lengths of short air bridges. Another problem is that circuits fabricated with air bridges cannot be passivated. In a normal process, the passivation layer is deposited on top of an integrated circuit. Typical passivation layers are silicon oxide or silicon nitride. However, for air bridge structures, the passivation layer has to be omitted otherwise the passivation layer will fill the air under the bridge and thereby increase the capacitance of the air bridge or damage the bridge itself. Plastic packaging is also precluded for the same reasons.

Accordingly, there has arisen a need for air bridges that can be made of longer lengths of metal than are available in air bridges of the prior art and also for air bridges that can be incorporated into integrated circuits which are passivated and/or in plastic packages.

SUMMARY OF THE INVENTION

It is the principal object of the present invention to provide improved integrated circuit air bridge structures which may be fabricated using bonded wafer silicon-on-insulation technology.

It is a still further object of the present invention to provide improved integrated circuit air bridge structures having air bridges or other components made out of conductive elements (e.g., inductors or capacitors), wherein sufficient spacing is provided between the air bridges of the components and the active integrated circuit so as to reduce the effect of parasitic capacitance between the conductive elements and the circuits and adversely affecting the high frequency response of these circuits, as well as to methods of fabricating such structures.

The invention may attain one or more, but not necessarily all, of the foregoing objects.

Briefly described, an air bridge structure is formed in a bonded wafer by masking and etching a cavity in the surface of the handle wafer. A device wafer is bonded to the handle wafer. A metal layer is deposited on the surface of the device wafer over the handle wafer cavity. A trench may be formed around the portion of the device wafer over the cavity. The metal layer is patterned to form interconnect areas. The cavity beneath the metal interconnect reduces parasitic capacitance of the metal lead.

The foregoing and other objects, features and advantages of the invention as well as presently preferred embodiments thereof and the best known techniques for fabricating integrated circuit structures in accordance with the invention will become more apparent from a reading of the following description in connection with the accompanying drawings.

DETAILED DESCRIPTION

Figure 1:
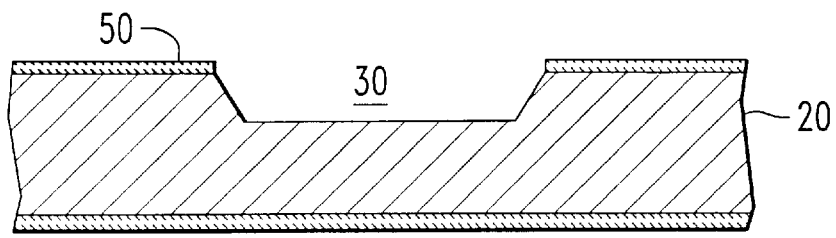
FIGS. 1 and 2 are sectional views of the bridge device shown in two early stages of fabrication thereof.
Figure 2:
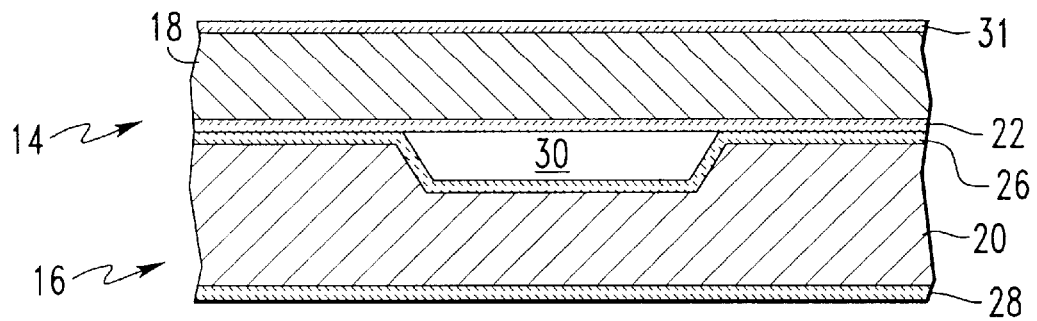
Figure 3:
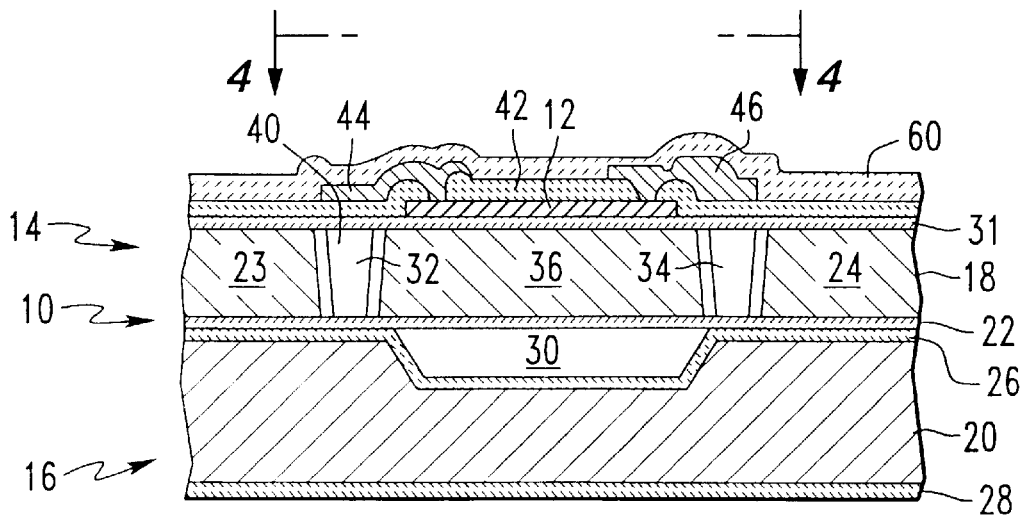
FIG. 3 is a cross-sectional view of a portion of an integrated circuit device containing a conductive material in a bridge configuration wherein the structure is bonded and enclosed to facilitate handling and preventing contamination of the device.

FIGS. 1–3 show an example of how to fabricate the air bridge conductor in a bonded wafer silicon-on-insulator technology. A layer 20 of the handle wafer 16 is masked with a photoresist coating 50 to define the region where the cavity 30 is formed, by using a wet or dry etch. In some cases, it may be desirable to have an oxide or some other suitable layer beneath the photoresist coating to improve the photoresist adhesion. A wet etch with potassium hydroxide (KOH) is preferred. Then oxide layers 26 and 28 are formed either by deposition or by growing these layers (reoxidization). The oxide layer 26 of handle wafer 16 is bonded to the oxide layer 22 of the device wafer 14 in a manner known to those skilled in the art, to form a bonded silicon-on-insulator substrate 10. The bonded substrate 10 has the closed space or cavity 30 in the handle wafer 16. The bonded substrate 10 has a trench 40. The trench 40 is formed by etching device wafer 14 and stopping the etch on the oxide layer 22. The trench walls are coated with oxide and filled with suitable material, either oxide or polysilicon. A layer of oxide 31 covers the device wafer in a region above the cavity 30. A first metal layer is deposited on oxide 31. The first metal layer is patterned and etched to form a metal interconmect or conductor 12. An interlevel dielectric (ILD) layer 42 covers conductor 12. ILD layer 42 has openings to the conductor 12. A second metal layer is deposited on the ILD layer 42 and in the openings to contact the conductor 12. The second layer of metal is patterned and etched to provide interconnection for metal 1 at points 44, 46.

Referring to FIG. 3, there is shown a bonded wafer structure 10 having an air bridge structure 12 in a device wafer 14 bonded to a handle wafer 16. The device wafer 14 has one or more integrated circuit device structures (not shown) fabricated simultaneously in layers of device wafer 14. Where the device and handle wafer 14, 16 comprises silicon, the wafers 14, 16 may be bonded together by one of several known techniques, including the use of an oxide bonding layer 26. These bonded structures 10 are then separated into dies containing an individual integrated circuit device or devices. It is a feature of this invention to provide complete devices which are then separated or diced, forming individual dies each having a complete integrated structure.

The integrated structure illustrated in FIG. 3 is shown by way of cross-section which omits bond pads for leads to the integrated circuit devices which are formed in regions 23 and 24 and 36 of the layer 18 of device wafer 14. The layer 18 may have a bottom surface coating of insulating, oxide material (an oxide layer 22). The layer 20 of handle wafer 16 is a semiconductor layer disposed between oxide layers 26 and 28. A cavity 30 is provided in the layer 20 which may be coated with the oxide layer 26. By coating it is meant any suitable process conventionally used in the semiconductor art, such as thermal oxidation or deposition.

The device wafer 14 has a trench 40 with sides 32 and 34. The trench 40 defines a region 36 which is isolated from the other regions 23 and 24. This region is isolated by insulating or dielectric coating material, such as oxide, that covers the trench walls and floor. The trench 40 is filled with suitable material, such as deposited oxide or polysilicon, in a manner well-known in the art. An integrated circuit device may be formed by conventional integrated circuit fabrication techniques in the region 36 between trenches 40 as well as in regions 23 and 24.

The cavity 30 as well as the trench 40 minimize the parasitic capacitances between the active circuits in the layer 18, its regions 23, 24, and 36 and the air bridge 12. The handle wafer 20 and the device wafer 14 are joined and aligned, so that the cavity 30 is below the region 36. Bonding is done by conventional oxide bonding (e.g., silica fusing) techniques to the device wafer 18 to form the substrate 10.

Figure 4:
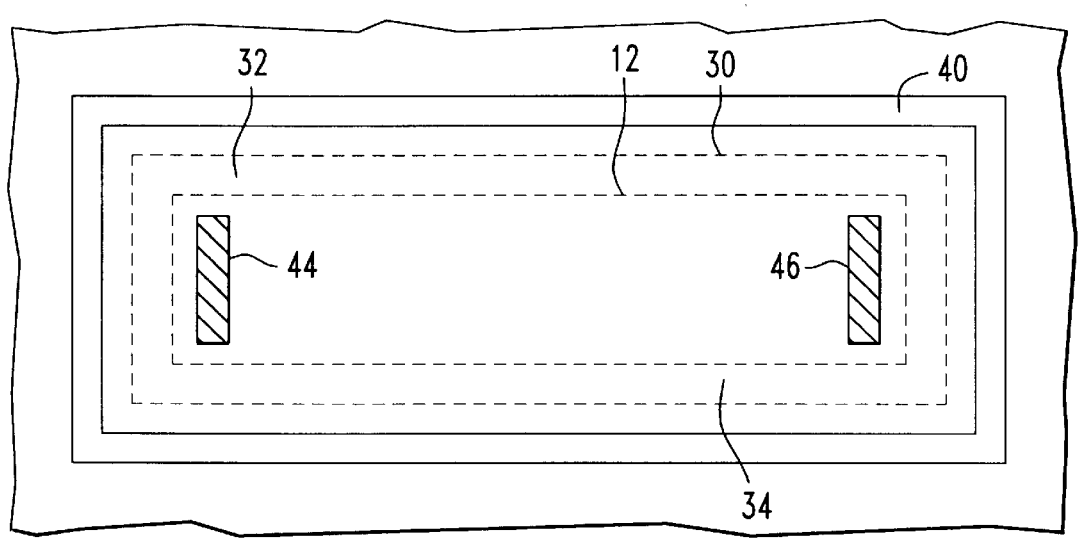
FIG. 4 is plan view of a portion of the device shown in FIG. 3 taken along the line 4—4 when viewed in the direction of the arrows extending from that line.

The air bridge conductor 12 is made from a layer of metal that is surrounded by trench 40. Trench 40 sides 32 and 34 as shown in FIG. 4, surrounds and isolates the air bridge conductor 12. The trench also surrounds and isolates the cavity 30. The cavity 30 is located between the conductor 12 and handle wafer 16, so the capacitance between conductor 12 and substrate 16 is greatly reduced. It is also possible to isolate metal 2 in a manner similar to the one used for metal 1.

An interlevel dielectric layer (ILD) 42 is deposited over the conductor 12. Vias are formed in ILD layer 42. A second level of metal in deposited on the ILD layer 42 and in the vias. The second level of metal is patterned to provide interconnections contacts 44, 46. Finally, a layer 60 of passivation material, such as $SiO_2$, or silicon nitride is deposited or formed over the ILD 42 and the contacts metal 2 interconnects 44 and 46 to complete the structure 10.

Isolation from the substrate of sensitive circuit elements can also be achieved by using a cavity on the handle wafer.

Having disclosed one embodiment, those skilled in the art will know that further additions, modifications, changes, and alterations can be made to the disclosed embodiment without departing from the spirit and scope of the invention as claimed below.

What I claim is:

1. A method for forming an air bridge in a bonded wafer comprising the steps of forming a cavity having a surface in a handle wafer;

covering the surface of the cavity with a dielectric layer;

covering substantially all of a lower surface of a device wafer with an insulating layer to form an enclosed and dielectrically lined cavity;

bonding the insulating layer on the lower surface of a device wafer to the handle wafer;

covering an upper surface of the device layer with a first metal layer lying over the cavity of the handle wafer; and forming the first metal layer on the upper surface of the device wafer into a metal lead over the cavity of the handle wafer.

2. The method of claim 1 comprising the further step of oxide bonding the device wafer to the handle wafer.

3. The method of claim 1 comprising the further step of opening a trench in the device wafer around the cavity in the handle wafer;

depositing a dielectric on the surface of the trench; filling the trench.

4. The method of claim 1 comprising the further step of depositing an interlevel metal dielectric layer over the first metal layer;

opening contact vias through the interlevel metal dielectric layer; depositing a second metal layer over the interlevel metal dielectric layer;

forming portions of the second metal layer into contacts to the first metal layer through vias in the interlevel metal dielectric.

5. An air bridge on a bonded wafer comprising:

a handle wafer with an air bridge cavity having a surface in a surface of the handle wafer;

a device wafer with a lower surface substantially entirely covered with an insulating layer, bonded to the handle wafer and covering the air bridge cavity;

a metal lead on an upper surface of the device wafer; and a dielectric layer coating the surface of the air bridge cavity whereby the air bridge cavity is enclosed with a dielectric surface.

6. The air bridge structure of claim 5 further comprising:

an isolation trench having a surface in the device wafer and surrounding the air bridge cavity; and a dielectric coating on the surface of the trench.

7. The method of claim 1 wherein the lower surface of the device wafer is substantially free from devices.

8. The air bridge bonded wafer structure of claim 5 wherein the lower surface of the device wafer is substantially free from devices.

* * * * *